US006332815B1

(12) United States Patent
Bruce

(10) Patent No.: US 6,332,815 B1
(45) Date of Patent: Dec. 25, 2001

(54) CLIP RING FOR AN ELECTRICAL CONNECTOR

(75) Inventor: Burton B. Bruce, New Hartford, CT (US)

(73) Assignee: Litton Systems, Inc., Woodland Hills, CA (US)

( * ) Notice: Subject to any disclaimer, the term of this patent is extended or adjusted under 35 U.S.C. 154(b) by 0 days.

(21) Appl. No.: 09/458,082

(22) Filed: Dec. 10, 1999

(51) Int. Cl.[7] .................................................. H01L 13/432
(52) U.S. Cl. .......................... 439/862; 439/609; 439/578
(58) Field of Search .................................... 439/862, 860, 439/868, 883, 609, 578

(56) References Cited

U.S. PATENT DOCUMENTS 3,678,445 * 7/1972 Brancaleone ......................... 439/609
4,106,839 * 8/1978 Cooper ................................ 439/609
4,423,919 * 1/1984 Hillis .................................... 439/609
4,426,127 * 1/1984 Kubota ................................ 439/578
5,898,993 5/1999 Inaba et al. .

FOREIGN PATENT DOCUMENTS 544 104 1/1932 (DE) .
2 667 451 3/1992 (FR) .

* cited by examiner

*Primary Examiner*—Tho D. Ta
(74) *Attorney, Agent, or Firm*—Lowe Hauptman Gilman & Berner, LLP

(57) ABSTRACT

The present invention is directed to an integrally formed clip ring made out of a conductive resilient material such as beryllium copper. The clip ring is used for retaining a male member and a female member of an electrical connector and for forming a ground circuit between the male member and the female member of the electrical connector. The clip ring of the present invention fully engages the outside diameter of the male retaining groove and the inside diameter of the female retaining groove simultaneously. Advantageously, this eliminates the potential for discontinuities in a ground circuit in a vibrational environment. The clip ring includes an annular-shaped body having an inner wall and an outer wall where the outer wall has a plurality of circumferentially spaced slots. The outer wall has a first end circumferentially spaced from a second end wherein when the clip ring is compressed a first end and a second end are brought into contact with each other. In this manner, a complete 360° contact is maintained when the male member and the female member are fully engaged.

1 Claim, 2 Drawing Sheets

CLIP RING FOR AN ELECTRICAL CONNECTOR

FIELD OF THE INVENTION

The present invention relates generally to clip rings, and more particularly to clip rings for electrical connectors.

BACKGROUND OF THE INVENTION

Depicted in FIGS. 1A and 1B is a simple "C" ring that fits in a groove on a male member of a mated pair of electrical connectors. When the male member and the female member are being engaged, this "C" ring is compelled to close into the groove on the male member so that the inside diameter of the female member may pass around it. Once the male member and the female member are fully engaged there is a concentric undercut groove in the female member that the "C" ring on the male member engages by springing back and partially engaging the outside diameter of the retaining groove of the male member and the inside diameter of the retaining groove of the female member.

The problem with the "C" ring depicted in FIGS. 1A and 1B is that the "C" ring can only touch a portion of the inside diameter of the female connector and a portion of the male connector simultaneously. The "C" ring can rattle in a vibrational environment causing a discontinuity in the circuit. In addition, the insertion withdrawal forces cannot be accurately tuned to the needs of the user. Accordingly, a need exists for a clip ring in which the insertion forces can be accurately predicted, and in which a complete electrical circuit is completed when the male member and the female member are fully engaged.

SUMMARY OF THE INVENTION

It, therefore, an object of the present invention to provide a clip ring in which the insertion withdrawal forces can be kept within a narrow band.

Another object of the present invention is to provide a clip ring which provides an excellent grounding path completing a ground circuit between a male and female connector when the male member and the female member are fully engaged.

It is yet another object of the present invention to provide a retaining clip in which the outside diameter and inside diameter of the clip extend for a fully 360° contact with both the female member and the male member when the male member and the female member are fully engaged.

It is yet another object of the present invention to provide a clip ring in which the withdrawal and insertion forces can be tuned to a great degree by varying the material thickness and beam length of the fingers of the clip ring.

The present invention is directed to an integrally formed clip ring made out of a conductive resilient material such as beryllium copper. The clip ring is used for retaining a male member and a female member of an electrical connector and for forming a ground circuit between the male member and the female member of the electrical connector. The clip ring of the present invention fully engages the outside diameter of the male retaining groove and the inside diameter of the female retaining groove simultaneously. Advantageously, this eliminates the potential for discontinuities in a ground circuit in a vibrational environment. The clip ring includes an annular-shaped body having an inner wall and an outer wall where the outer wall has a plurality of circumferentially spaced slots. The outer wall has a first end circumferentially spaced from a second end wherein when the clip ring is compressed a first end and a second end are brought into contact with each other. In this manner, a complete 360° contact is maintained when the male member and the female member are fully engaged.

These and other objects of the present invention are achieved by a resilient clip ring which includes an annular-shaped body having an inner wall and an outer wall. The outer wall has a plurality of circumferentially spaced slots.

The foregoing and other objects of the present invention are achieved by a resilient clip ring which includes an annular-shaped body having an inner wall and an outer wall. The outer wall has a plurality of circumferentially spaced slots. The body has a first end circumferentially spaced from a second end. The first end and the second edge are brought into contact when the clip ring is inserted into a groove.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

BEST MODE FOR CARRYING OUT THE INVENTION

Figure 2:
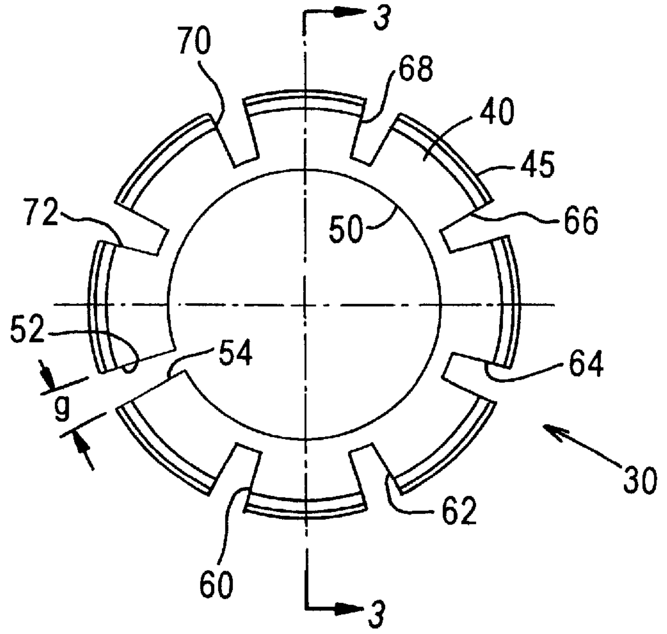
FIG. 2 is a top plan view of a clip ring according to the present invention.

Referring first to FIG. 2, a bottom plan view of a clip ring 30 according to the present invention is depicted. The clip ring 30 includes an annular body 40 having an outer surface 45 and an inner surface 50. A first edge 52 and a second edge 54 are circumferentially spaced from each other and form a gap g. As depicted in FIG. 2, seven slots extend from outer wall 45 and are equally circumferentially spaced. The seven slots 60–72 and the gap g essentially form eight weak areas in the body 40 thereby providing flexibility to the clip ring 30. The slots 60–72 and the gap g are equally circumferentially spaced. Slots 60, 62, 64, 66, 68, 70, 72 extend inwardly from the outer wall 45 and terminate before inner wall 50.

Figure 3:
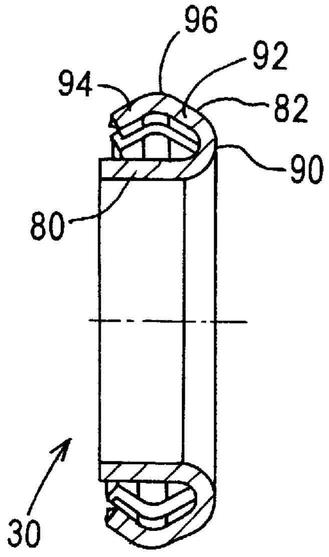
FIG. 3 is a cross-sectional view taken along lines 3—3 in FIG. 2.
Figure 1A:
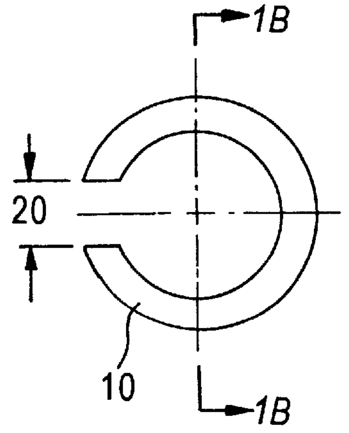
FIG. 1A (PRIOR ART)
FIG. 1A is a top view of a prior art clip ring.
Figure 1B:
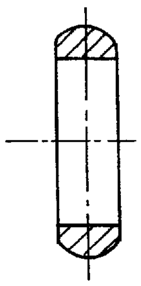
FIG. 1B is cross-sectional view taken along lines 1B—1B of FIG. 1A depicting a cross-sectional view of the clip ring.

As depicted in FIG. 3, clip ring 30 has an inner section 80 and outer fingers 82 formed between each of the inwardly extending slots. Although seven slots are depicted, any number of slots can be used. As should be understood, the more slots that are used the lower the insertion forces would be for any given material thickness and the fewer slots that are used for any given material thickness will increase insertion withdrawal forces. Each of the fingers 82 has a first rounded section 90 which connects the finger 82 to the inner wall 80, a front ramp section 92 and a rear ramp section 94.

Figure 4:
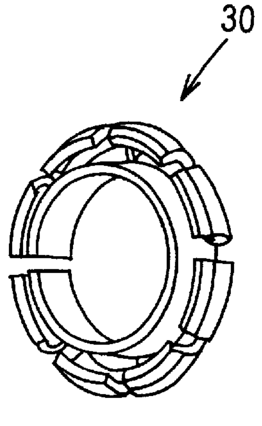
FIG. 4 is a bottom perspective view of the clip ring according to the present invention.

As depicted in FIG. 4, the rear ramp section 94 is spaced from the inner wall 80. Referring back to FIG. 3, front ramp section 92 and rear ramp section 94 meet at a knuckle portion 96.

Figure 5:
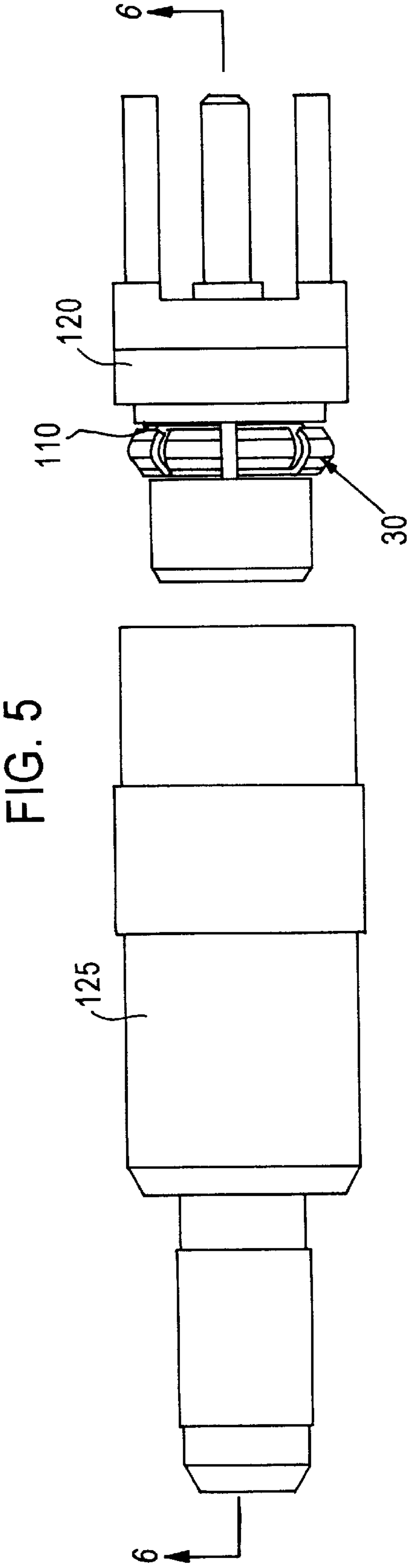
FIG. 5 is a side elevational view of an exemplary electrical connector in an uncoupled condition which is usable with the inventive clip ring of the present invention.
Figure 6:
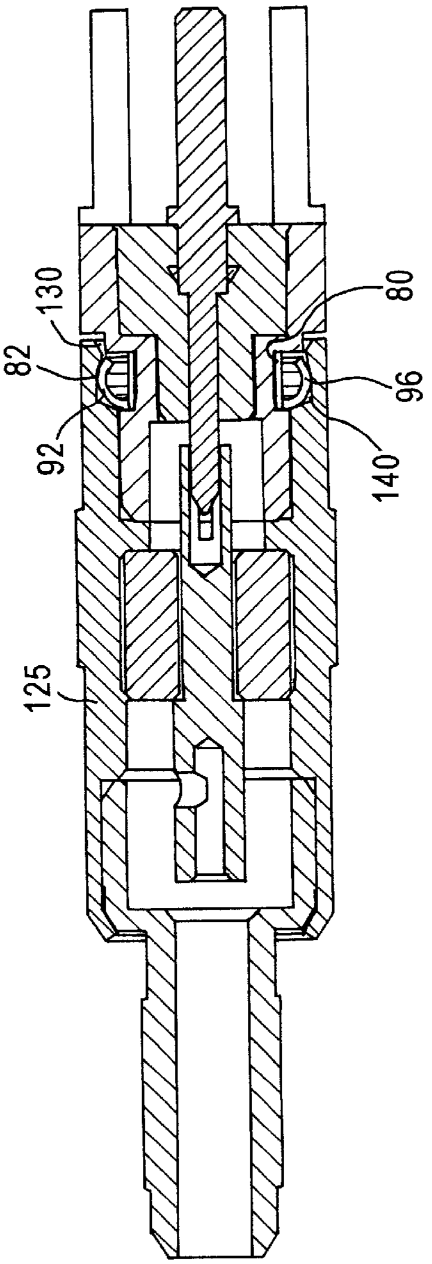
FIG. 6 is a cross-sectional view taken along lines 6—6 in FIG. 5 within the electrical connector in a coupled condition.

As depicted in FIG. 5, the clip ring 30 is positioned in a groove 110 in a male connector 120 for mating with a female connector 125. The components of the male connector 120 and the female connector 125 are not described herein as they form no part of the present invention. It should be appreciated that the clip ring 30 according to the present invention is usable on any type of male/female connector which are mated in a push/pull manner. In operation, when one connector is being inserted into the other, front ramp section 92 will make contact with a lead in ramp 130 on the female connector 125, the outer diameter of the female connector 125, thereby causing the outer section 82 to flex radially inwardly. That is, rear section 94 will be brought nearer to inner wall 80. The knuckle portion 96 will be brought into contact with the inner diameter 140 of the female connector 125. Upon full insertion into the groove, the portion 82 will flex radially outwardly and be in full engagement with the inner diameter 140. Most preferably, the inner diameter 140 will have a curved shape as depicted in FIG. 6. The shape of the curved surface should be such that rear ramp section 94 is in contact with the curved surface when the clip ring 30 is fully inserted into the female connector 125. The shape of the curved surface will help retain the clip ring 30 in the curved surface.

As should be appreciated, the clip ring 30 of the present invention will fully engage the outside diameter of the male retaining groove and the inside diameter of the female retaining groove simultaneously. Further, upon insertion of the clip ring into the groove, the gap will be closed and surfaces 52 and 54 will be brought into contact with each other. This eliminates the potential for discontinuities in the ground circuit in a vibrational environment. In addition, the insertion and withdrawal forces can be tuned to a greater degree by varying the material thickness and the beam length of the fingers 82.

It will be readily seen by one of ordinary skill in the art that the present invention fulfills all of the objects set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

What is claimed is:

1. An electrical joint, comprising:

a male electrical connector, a mating female electrical connector; and a resilient electrically conductive clip ring for electrically connecting an outer diameter of said male connector with an inner diameter of said female connector, said clip ring comprising:

an annular-shaped body having an inner wall and an outer wall;

said inner wall engaging said outer diameter of said male connector;

said outer wall having a plurality of circumferentially spaced slots and said inner diameter of said female connector, said outer wall being operatively elastically flexible radially inwardly toward said inner wall when said clip ring is brought by said male connector into an interior of said female connector;

wherein said outer wall is received within a first groove formed in said inner diameter of said female connector; and said outer wall includes a first section angled to form a lead-in section when said clip ring is inserted into said first groove and a second section angled to form a lead-out section when said clip ring is removed from said first groove.

* * * * *

UNITED STATES PATENT AND TRADEMARK OFFICE

CERTIFICATE OF CORRECTION

PATENT NO. : 6,332,815 B1 
DATED : December 25, 2001
INVENTOR(S) : Burton B. Bruce It is certified that error appears in the above-identified patent and that said Letters Patent is hereby corrected as shown below:

<u>Column 4,</u>
Lines 15-41, please replace claim 1 as follows:

1. An electrical joint, comprising:
a male electrical connector,
a mating female electrical connector; and
a resilient electrically conductive clip ring for electrically connecting an outer diameter of said male connector with an inner diameter of said female connector, said clip ring comprising:
an annular-shaped body having an inner wall and an outer wall;
said inner wall engaging said outer diameter of said male connector;
said outer wall having a plurality of circumferentially spaced slots and engaging said inner diameter of said female connector, said outer wall being operatively elastically flexible radially inwardly toward said inner wall when said clip ring is brought by said male connector into an interior of said female connector;

Signed and Sealed this

Fifteenth Day of April, 2003

JAMES E. ROGAN
*Director of the United States Patent and Trademark Office*